US008762798B2

(12) United States Patent
Hu et al.

(10) Patent No.: US 8,762,798 B2
(45) Date of Patent: Jun. 24, 2014

(54) DYNAMIC LDPC CODE RATE SOLUTION (71) Applicant: STEC, Inc., Santa Ana, CA (US)

(72) Inventors: Xinde Hu, San Diego, CA (US);
Richard D. Barndt, San Diego, CA (US)

(73) Assignee: STEC, Inc., Santa Ana, CA (US)

( * ) Notice: Subject to any disclaimer, the term of this patent is extended or adjusted under 35 U.S.C. 154(b) by 0 days.

(21) Appl. No.: 13/678,416

(22) Filed: Nov. 15, 2012

(65) Prior Publication Data

US 2013/0124945 A1 May 16, 2013

Related U.S. Application Data (60) Provisional application No. 61/560,762, filed on Nov. 16, 2011.

(51) Int. Cl.
*G06F 11/00* (2006.01)
*G11C 29/00* (2006.01)
*G06F 11/10* (2006.01)
*H03M 13/25* (2006.01)

(52) U.S. Cl.
CPC ........ *G06F 11/1048* (2013.01); *G06F 11/1072* (2013.01); *G06F 11/108* (2013.01); *H03M 13/255* (2013.01)
USPC .......................................... 714/704; 714/769

(58) Field of Classification Search
CPC ............ G06F 11/1048; G06F 11/1072; G06F 11/108; G06F 11/1068; G11C 29/00; H03M 13/29; H03M 13/255; H03M 13/11
USPC ......... 714/746, 774, 704, 769, 763–764, 773; 711/103; 365/185.05
See application file for complete search history.

(56) References Cited

U.S. PATENT DOCUMENTS

| 5,270,979 | A | * | 12/1993 | Harari et al. ............. 365/185.09 |
| 6,757,122 | B1 | | 6/2004 | Kuznetsov et al. |
| 8,091,013 | B2 | | 1/2012 | Blanksby et al. |
| 8,239,735 | B2 | * | 8/2012 | Shalvi et al. ................. 714/774 |
| 2005/0149845 | A1 | | 7/2005 | Shin et al. |
| 2007/0011568 | A1 | | 1/2007 | Hocevar |
| 2007/0038914 | A1 | | 2/2007 | Bickerstaff et al. |
| 2007/0089025 | A1 | | 4/2007 | Hong et al. |
| 2007/0245217 | A1 | | 10/2007 | Valle |
| 2008/0065953 | A1 | | 3/2008 | Sun et al. |

(Continued)

OTHER PUBLICATIONS

C. Fewer, et al., "A Versatile Variable Rate LDPC Codec Architecture," IEEE Transactions on Circuits and Systems-I: Regular Papers, Oct. 2007, pp. 2240-2251, vol. 54-No. 10, IEEE.

(Continued)

*Primary Examiner* — Shelly A Chase
(74) *Attorney, Agent, or Firm* — McDermott Will & Emery LLP (57) ABSTRACT

The subject technology includes adjusting an error correcting code rate in a solid-state drive. A first plurality of memory operations are performed on a flash memory device of the solid-state drive using a first code rate. During operation of the drive, a controller monitors an operating condition associated with one or more memory units of the flash memory device for a trigger event. On the trigger event, the first code rate is adjusted in accordance with the operating condition to produce a second code rate, and a second plurality of memory operations is performed on the flash memory device using the second code rate.

20 Claims, 4 Drawing Sheets

(56) References Cited

U.S. PATENT DOCUMENTS

| | | | |
|---|---|---|---|
| 2008/0065956 A1 | 3/2008 | Blankenship et al. | |
| 2008/0320374 A1 | 12/2008 | Prabhakar et al. | |
| 2010/0251059 A1 | 9/2010 | Dielissen | |
| 2011/0055461 A1* | 3/2011 | Steiner et al. | 711/103 |
| 2011/0179337 A1 | 7/2011 | Chen et al. | |
| 2011/0246842 A1* | 10/2011 | Haratsch et al. | 714/722 |
| 2011/0252289 A1* | 10/2011 | Patapoutian et al. | 714/763 |
| 2011/0264979 A1 | 10/2011 | Gunnam et al. | |
| 2011/0289382 A1 | 11/2011 | Shih et al. | |
| 2012/0233524 A1 | 9/2012 | Varnica et al. | |
| 2013/0139038 A1 | 5/2013 | Yosoku et al. | |

OTHER PUBLICATIONS

R. Tanner, et al., "LDPC Block and Convolutional Codes Based on Circulant Matrices," IEEE Transactions on Information Theory, Dec. 2004, pp. 2966-2984, vol. 50-No. 12, IEEE.

"Low-Density Parity-Check Code," Wikipedia, modified Jan. 1, 2012, pp. 1-7, <http://en.wikipedia.org/wiki/Ldpc>.

"Generating the Parity Check Matrix," retrieved on Nov. 3, 2011, 1 page, <http://arun-10.tripod.com/ldpc/generate.html>.

* cited by examiner

DYNAMIC LDPC CODE RATE SOLUTION

CROSS-REFERENCES TO RELATED APPLICATIONS

This application claims priority from U.S. Provisional Application No. 61/560,762, entitled FLEXIBLE CODE RATE LDPC SOLUTION and filed Nov. 16, 2011, which is incorporated herein by reference in its entirety. This application is related to U.S. application Ser. No. 13/343,684, entitled MULTI-RATE LDPC DECODING and filed Jan. 4, 2012, which is incorporated herein by reference in its entirety.

TECHNICAL FIELD

The subject technology relates generally to data storage devices that utilize error correction coding (ECC).

BACKGROUND

Data storage applications (for example, solid state drives, hard disk drives, and the like) may use low density parity check (LDPC) to correct errors that occur when storing and reading, or sending and receiving information. One design choice in planning LDPC coding systems is an amount of redundancy (ECC parity bits) used to meet the product specification. This redundancy is represented by the code rate of an LDPC code, which is equal to the user data length divided by the total number of bits stored. The general trend is that the lower the code rate is (more redundancy added), the better protection of the user data, and better performance in error detection and correction. If the code rate is chosen too high, the device may fail before the targeted program/erasure lifetime due to increasing error rates. On the other hand, if the code rate is chosen too low, extra storage space is wasted. Different LDPC encoder/decoder designs are implemented for different code rates, and for different chips/technologies or applications. Devices from different manufacturers may utilize different code rates, and, in that regard, code rates may span a wide range.

A flash memory chip has vastly different behavior at the beginning of life ("BOL") and at end of life ("EOL") scenarios. In particular, the data error rates from the flash memory chip increase dramatically as the flash memory chip ages. For example, the raw bit error rate ("BER") produced during read operations may increase by a magnitude of 100 between 1K and 30K program/erase ("P/E") cycles.

SUMMARY

A computer-implemented method for adjusting a code rate in a solid-state drive is disclosed. According to one aspect, the method may comprise performing a first plurality of memory operations on a flash memory device using a first code rate, monitoring an operating condition associated with one or more memory units of the flash memory device for a trigger event, adjusting, on the trigger event, the first code rate in accordance with the operating condition to produce a second code rate, and performing a second plurality of memory operations on the flash memory device using the second code rate. Other aspects include corresponding systems, apparatus, and computer program products.

In another aspect, a machine-readable medium may have instructions stored thereon that, when executed, cause a machine to perform a method of adjusting a code rate in a solid-state drive. In this regard, the method may include receiving a first quantity of host data, encoding, for storage in one or more memory units, a first quantity of host data at a first code rate, the first code rate corresponding to a predetermined code rate value, monitoring one or more operating conditions associated with the one or more memory units for a trigger event, adjusting, on a predetermined trigger event, the code rate value, receiving a second quantity of host data, and encoding, for storage in the one or more memory units, a second quantity of host data at a second code rate.

In a further aspect, a system includes a flash controller, one or more flash memory devices, and one or more embedded memories associated with the controller. The memories have instructions stored thereon that, when executed, may cause the flash controller to monitor one or more operating conditions associated with the one or more flash memory devices for one or more trigger events, and adjust, on a predetermined trigger event, a code rate used in current memory operations performed by the flash controller by an amount sufficient to reduce, below a predetermined threshold, a read error rate produced in connection with future memory operations.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical element numbers for ease of understanding.

The subject technology provides an encoding and decoding system, and more particularly a LDPC code encoding and decoding system that supports different code rates. In this regard, an encoder may be set to encode a data payload, received from a host system, into a codeword using a code rate selected from a group of code rates. During the encoding process, an LDPC codeword, a linear block code c of length n, may be generated from a G matrix and a data payload u (for example, a series of k bits of data), as shown in Equation (1).

$$c = u \cdot G \quad (1)$$

Conversely, the codeword c may be decoded using a parity-check matrix, also termed an "H matrix." The H matrix may be generated from a corresponding G matrix, and vice versa, such that $G \cdot H^T = 0$. In LDPC codewords, the Shannon-limit can be achieved by increasing the codeword length n.

A solid state drive comprises one or more flash memory devices. These flash memory devices provide a first amount of storage available for user data (e.g., host data usage) and a second amount of storage reserved for SSD controller operations (e.g., over provisioning), such as ECC redundancy, garbage collection, and the like. In enterprise applications, the amount of user data stored on the SSD is always at a maximum capacity, leaving little, if any, free space. Data is frequently updated by erasing and reprogramming.

The overall requirements of acceptable error rates after error detection and correction (for example, using error correcting codes) may remain within a constant range throughout the life of the SSD (for example, below an error rate of 1e-17). However, conventional ECC systems are configured for one type of codeword and do not change code rates. Thus, the code rate used may have to be set to the lowest possible code rate known to handle end-of-life error scenarios. This way, at beginning-of-life, the storage available for ECC redundancy may not be fully utilized. For example, a SSD may not need the entire amount of ECC redundancy available to maintain acceptable failure rates.

Because flash memory generally must be erased before it can be rewritten, a single write operation may cause the SSD to perform multiple erase and reprogramming operations to move data and make available the storage required for writing user data. This multiplying effect, termed "write amplification," increases the number of program/erase ("P/E") cycles over the expected life of the SSD, and shortens the time that the SSD can reliably operate. Write amplification is defined as the ratio between total host writes (e.g., to the SSD) and total flash writes (e.g., to the flash memory die), in part, as a result of the garbage collection process, and is generally an undesirable phenomenon associated with flash memory and SSDs. Write amplification has a significant impact on the aging of flash chips in an SSD. Higher write amplification may lead to inflated P/E cycles. In other words, for the same host writes (number of writes the user/host actually performs), high write amplification yields a higher number of P/E cycles. The additional writes may also consume bandwidth to the flash memory, which mainly reduces random write performance to the SSD. Many other factors may also affect the write amplification of an SSD, some controlled by the user and some a direct result of the data written to, or usage of, the SSD.

At beginning of life ("BOL"), a SSD system does not require the use of a low code rate in error detection and correction. The subject technology modifies code rates used by the SSD throughout the life of the drive. In this respect, code rates are reduced, over the life of the SSD, by an amount sufficient to sustain, or reduce below a predetermined threshold, an error rate produced in connection with memory operations (for example, a raw read error rate). At BOL, the code rate is set to a high rate code (for example, 0.94) and, as the flash chip ages, the system switches to a lower code rate. Using the dynamic LDPC code rates may alleviate the write amplification factor, and extend the life of the SSD.

Reducing code rates has a direct impact on reducing raw error rates. Accordingly, as the raw error rate is expected to increase over the life of the SSD, the code rate used in memory operations may be reduced to sustain an acceptable error rate. Lower code rates also yield higher ECC redundancy, which may require more flash memory devices to be utilized by an SSD even though the SSD's user capacity remains the same (for example, resulting in higher costs). Table A demonstrates example raw bit error rates ("BER"), and corresponding code rates, required to maintain a desired BER over the life of a SSD.

TABLE A

| P/E cycle | Average Raw BER | LDPC code rate required |
| --- | --- | --- |
| 0~10K | <0.001 | 0.94 |
| 10K~26K | 0.001~0.003 | 0.89 |
| 26K~50K | 0.003~0.02 | 0.83 |

In one example, a SSD may comprise a raw data capacity of 140 GB, with 100 GB allocated to user data usage and 40 GB allocated for SSD controller operations. Part of the 40 GB storage may be allocated for error correcting code redundancy, and the other part for over-provisioning. In some aspects, the write amplification factor may be a function of the over-provisioning factor. Studies of certain SSDs have demonstrated that, with 20% of the SSD allocated for over-provisioning, 18K write operations initiated by a host system on a group of blocks yields around 50K actual writes to the same group due to write amplification. With 40% of the SSD allocated for over-provisioning, the total writes performed has been demonstrated to be around 30K for the same 18K writes. Accordingly, the amount of over-provisioning storage allocated may determine a total number of actual write operations that may be performed on the flash memory, and consequently how many write operations may be initiated by a host system before a monitored error rate falls below a predetermined threshold.

Figure 1A:
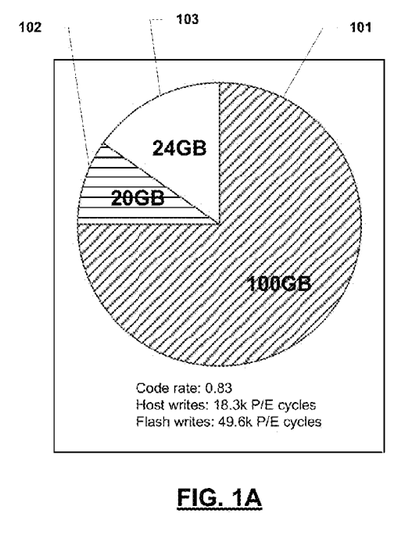
FIGS. 1A-1D depict example charts of host data usage, ECC redundancy, and over-provisioning for a SSD.

FIGS. 1A-1D depict example charts of host data usage, ECC redundancy, and over-provisioning for a SSD, according to one aspect of the subject technology. In FIG. 1A, a total raw flash storage of the SSD may be 144 GB, with 100 GB in storage 101 for user data and 44 GB in storage for error detection 102 and correction and over provisioning 103. To maintain a desired raw error rate in an EOL scenario, the code rate may be lowered to 0.83 at BOL to provide a higher over-provisioning ratio for the SSD system, and reduce total writes performed over the life of the SSD. The depicted SSD may accommodate 49.6K total writes before the error rate falls below the desired threshold. With around 20% of the SSD (about 24 GB) allocated for over-provisioning, 49.6K total writes equates to about 18.3K writes performed by the host system to the SSD (providing a write amplification ratio of 2.6).

Figure 1B:
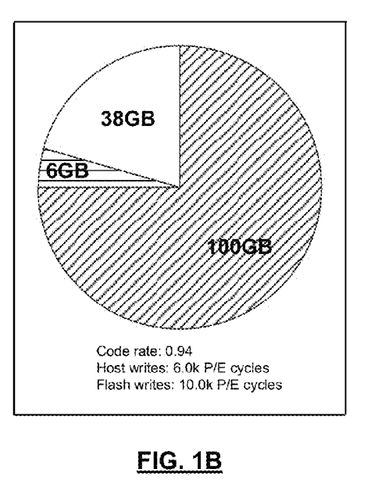
Figure 1C:
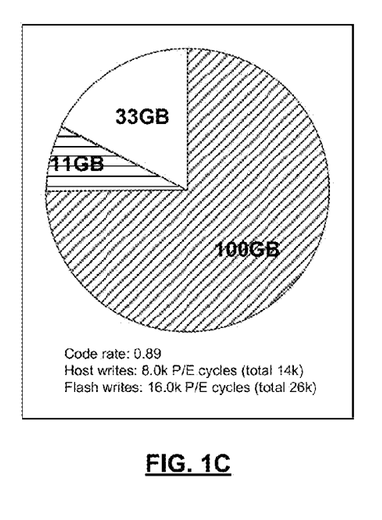
Figure 1D:
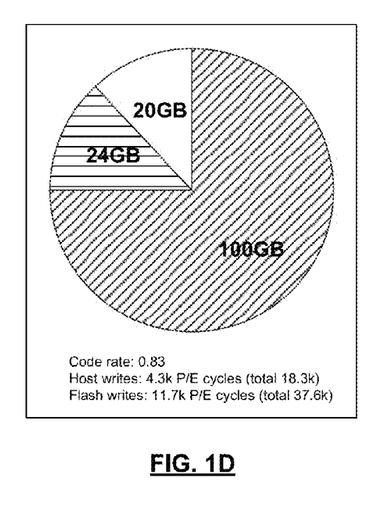

FIGS. 1B, 1C, and 1D depict employment of a dynamic code rate solution. In FIG. 1B, at BOL, the code rate is set to 0.94. Accordingly, 38 GB of memory space is allocated for over-provisioning. The write amplification ratio may be about 1.6 during the BOL period, until the host data writes reaches 10K. For a middle of life period (10K~26K P/E cycle), in FIG. 1C, the code rate is set to 0.89, and the amount of space for over-provisioning is adjusted to 33 GB. The write amplification ratio may be about 2.0 during this period. When the system reaches the end of life period (>26K total writes), in FIG. 1D, the code rate is set to 0.83. The write amplification ratio may be about 2.6 during this period (the same as in FIG. 1A). By reducing the code rate over time, the same 18K host data writes which yielded 49.6K total writes to flash memory in FIG. 1A, now only yields about 37.6K total writes, about a 20% reduction in overall write amplification for the SSD.

Accordingly, the error rate of the SSD is maintained below the desired threshold, and a lower number of total writes to flash memory are produced, preserving the integrity of the SSD and providing for a longer life span.

Figure 2:
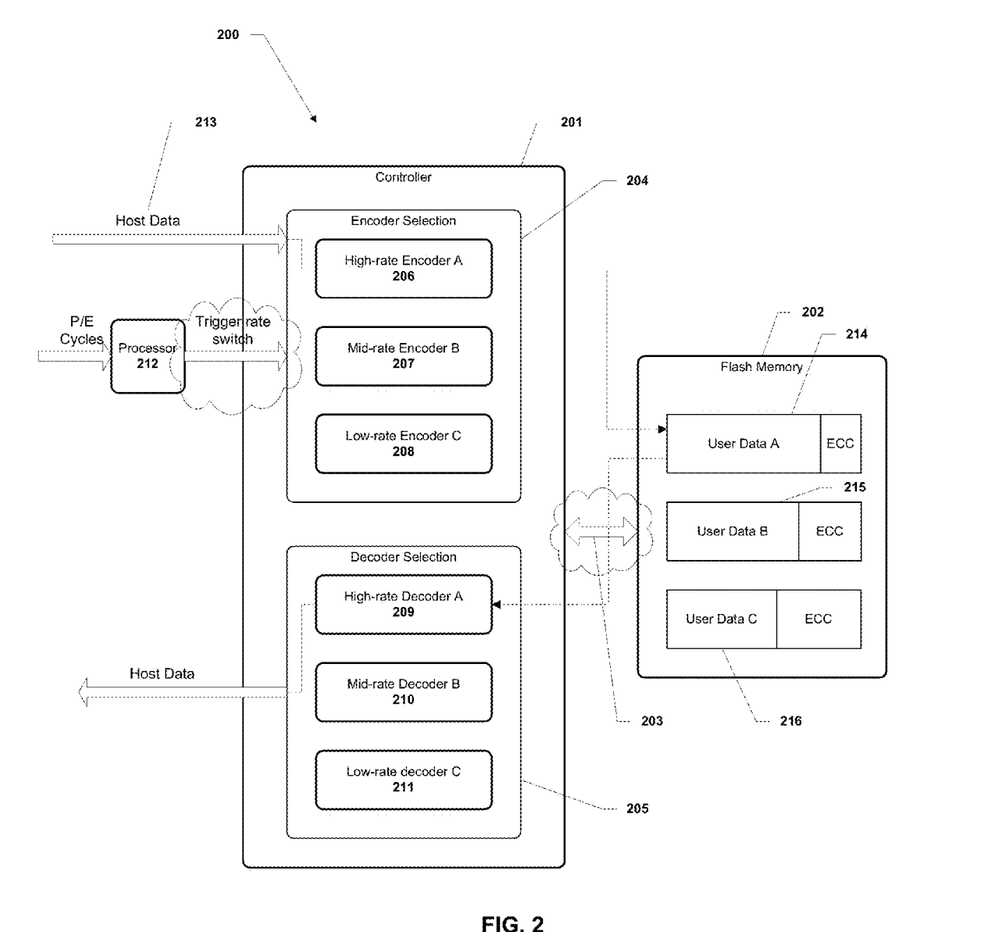
FIG. 2 depicts example components of a variable-rate encoding and decoding system.

FIG. 2 depicts example components of a variable-rate encoding and decoding system 200, according to one aspect of the subject technology. A SSD controller 201 is operably connected to one or more flash memory devices 202 over a memory channel bus 203. By example, and without limitation, controller 201 includes one or more encoder banks 204 of encoders and one or more banks 205 of decoders. Each bank includes a respective encoder or decoder for a predetermined code rate, with each bank facilitating encoding or decoding according to a selected code rate. In the depicted example, encoder bank 204 includes a high-rate encoder A 206, a mid-rate encoder 207, and a low-rate encoder 208. Likewise decoder bank 205 includes a high-rate decoder 209, a mid-rate decoder 210, and a low-rate decoder 211. The high-rate, mid-rate, and low-rate encoder/decoder combinations are operable to encode and decode data throughout the life of the SSD, at code rates described previously with respect to FIGS. 1B, 1C, and 1D. While the example of FIG. 2 depicts a system with multiple encoder and decoder pairs, each configured to a different code rate, the subject technology may similarly be implemented on a single encoder and decoder pair configured to change code rates. Such a device may be found in U.S. application Ser. No. 13/343,684, incorporated herein by reference.

Each encoder of encoder bank 204 processes input data to produce a codeword, including, for example, a data payload appended by error correction data. As described previously, an encoder is configured to encode a data payload u using an LDPC generator matrix G, to produce a codeword c. Codeword c may then be transmitted over memory channel bus 203 for storage in one or more flash memory devices 202. A selected decoder of decoder bank 205 may perform data decoding operations including, for example, use of a parity check matrix for matrix G, to reconstruct original data payload u.

System 200 further includes a processor 212 (for example, embedded within controller 201 or the SSD) to facilitate a dynamic switching between code rates used in encoder bank 204. In this regard, encoder bank 204 (and decoder bank 205) includes circuitry for switching between encoders (or decoders) in the bank. Processor 212 monitors a current operating condition associated with one or more memory units of flash memory device 202 for a trigger event. On the trigger event, processor 212 instructs encoder bank 204 to adjust the current code rate in accordance with the operating condition, by selection of an encoder, to produce a second code rate. In various aspects, the monitored operating condition may be the current number of P/E cycles associated with the one or more memory units, or flash memory device 202 in general. A memory unit may be a block, page, or sector of host data, or group of blocks, pages, or sectors, stored at an identifiable memory address on flash memory device 202. In some aspects, the monitored operating condition may be an error rate (for example, bit error rate, raw read error rate, and/or the like) corresponding to a read operation performed on a memory unit. Likewise, the trigger event may be a certain value or range of values for the operating condition. On satisfying the trigger event, encoder bank 204 is instructed by processor 212 to select between high-rate encoder A 206, mid-rate encoder 207, and a low-rate encoder 208, for encoding host data 213 received from a host system.

To facilitate the previously described adjustment of code rates, processor 212 may operate in connection with a code rate lookup table that cross-references operating condition values or ranges with encoding rates. In this regard, encoder bank 204 may include a register for selecting between high-rate encoder A 206, mid-rate encoder 207, and low-rate encoder 208. On determining that a current operating condition has satisfied a trigger condition (for example, by indexing the lookup table by the operating condition value), processor 212 may retrieve a register value from the lookup table, and set the register value of encoder bank 204 to select an encoder. Decoder bank 205 may similarly include a register for selecting between decoders.

A flash memory device 202 may store host data in different memory units at different times, and storage in a particular code rate format may vary by memory unit. For example, all host data stored in a block may be stored at a first selected code rate. Data stored in other blocks may be stored at different code rates. Processor 212 (or controller 201) may keep track of the code rate for each memory unit stored on flash memory device 202 by storing a code rate flag for the memory unit in a lookup table by the memory unit location. Additionally or in the alternative, the code rate flag may be stored with data in a corresponding memory unit. For example, a block or page of memory may include memory space for the code rate flag for that block or page. In this regard, to accommodate multiple code rates being stored in a single flash memory device, each encoder may encode host data with a code rate flag upon storage to one or more memory units in device 202. Similarly, the code rate flag may be appended to a code word or a payload of the code word.

With reference to FIGS. 1B, 1C, and 1D, as code rates change from higher values to lower values, the amount of user data stored for each host data unit will decrease, and space available for ECC and over-provisioning will increase. FIG. 2 depicts memory units stored on flash memory device 202 in three different code rates. A first memory unit 214 includes user data A stored at a code rate of 0.94. Accordingly, a minimal amount of corresponding ECC data is required for accurate decoding of the user data. A second memory 215 includes user data B stored at a code rate of 0.89. As shown by the depicted example, the amount of user data to ECC data has shifted such that there is less user data and more ECC data than seen in first memory unit 214. A third memory unit 216 includes user data C stored at a code rate of 0.83, with the amount of user data to ECC data shifting further. Since memory units may be stored in flash memory device 202 at different intervals of time with differing code rates, immediately after a trigger event and selection of a new code rate, there may be a period of time before all the memory units are refreshed. Memory units will remain at a single code rate until the memory unit is erased and reprogrammed, reclaimed by garbage collection or other over-provisioning mechanism.

As described previously, processor 212 monitors certain operating conditions (for example, average P/E cycles or error rate) and instructs encoder bank 204 to switch between code rates on a trigger event. During a beginning of life ("BOL") period, the operating condition is well within a desired range. Accordingly, processor 212 may verify that high-rate encoder A 206 is selected. In one example, host data 214 received by the encoder is then encoded at a high-code rate (for example, 0.94) and appended with a code rate flag, and then stored in one or more flash memory devices 202. When a memory unit is read from flash devices 202 during the BOL period, controller 201 determines the code rate for the memory unit from the code rate flag appended to the data. For BOL, controller 201 verifies decoder bank 205 is set to select high-rate decoding, and passes the stored memory unit to high-rate decoder A 209 to decode the stored data.

The monitored operating conditions are expected to decline (e.g., move toward an unsatisfactory level) over time, towards an end-of-life period. On a trigger event, processor 212 instructs encoder bank 204 to switch to a lower code rate. Because the monitored operating condition may be different for different memory units (for example, sectors or blocks), or for different flash memory devices 202, there may be a transition period wherein some host data 213 is stored at a first code rate and other host data 213 is stored at a second code rate. For example, on a first trigger event, new host data 213 for a first memory unit may be encoded using high-rate encoder A 206, while host data 213 for a second memory unit may be encoded using mid-rate encoder B 207. Likewise, when encoded data is read from flash device 202, encoded data for a first memory unit may be decoded using a high-rate decoder A 209, and encoded data for a second memory unit may be decoded using a mid-rate decoder B 210. Accordingly, on a second trigger event, processor 212 instructs controller 201 to encode new host data 213 using low-rate encoder C 208, which will subsequently be decoded by low-rate decoder C 211.

Figure 3:
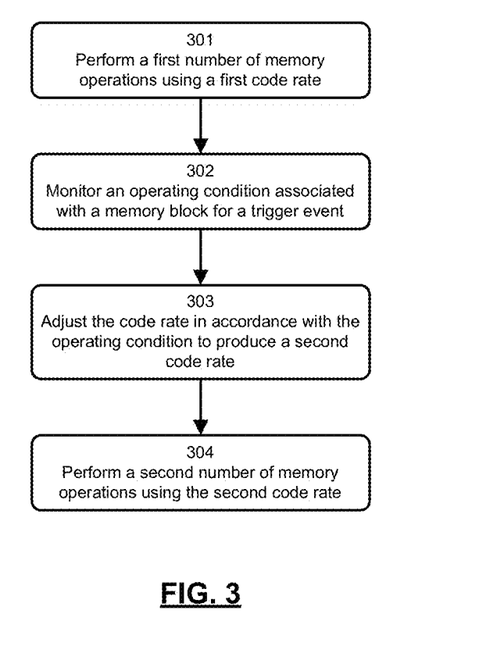
FIG. 3 is a flowchart illustrating a process for adjusting a code rate in a solid-state drive

FIG. 3 is a flowchart illustrating a process for adjusting a code rate in a solid-state drive, according to one aspect of the subject technology. According to one aspect, a SSD controller (for example, SSD controller) may be configured to automatically adjust a code rate used in an ECC algorithm for one or more memory blocks by execution of the following steps. In step 301, a first number of memory operations are performed on a flash memory device using a first code rate. The operating condition may include a number of program/erase (P/E) cycles or an error rate (for example, a raw read error rate).

In step 302, an operating condition associated with a memory block is monitored for a trigger event. In some aspects, the trigger event may include a current number of P/E cycles entering a predetermined range of P/E cycles. On the trigger event, in step 303, the code rate is adjusted in accordance with the operating condition to produce a second code rate. This may include, for example, indexing a lookup table by a current range of P/E cycles or range of error rates (depending on the monitored operating condition) to determine the second code rate. In this regard, the first code rate is reduced by an amount predetermined to sustain a raw read error rate associated with one or more memory blocks below a predetermined threshold for a predetermined number of P/E cycles. Accordingly, the second code rate may be a lower rate than the first code rate. Additionally, adjusting the first code may include adjusting a first amount of storage available for host data usage and an amount of storage reserved for hardware controller operations (for example, for ECC data, garbage collection, and the like), as described previously with regard to FIGS. 1B, 1C, and 1D.

In step 304, a second number of memory operations is performed using the second code rate. Over the life cycle of the SSD, different memory units may contain host data encoded at different code rates. For example, a first quantity of host data may be stored in a first number of memory units at a first code rate, and a second quantity of host data may be stored in a second group of memory units at a second code rate. In this regard, the method may further include decoding host data from the first number of memory units at the first code rate, and decoding host data from the second number of memory units at the second code rate. Additionally or in the alternative, a code rate flag may be stored in connection with encoding host data for one or more memory units. In connection with reading the one or more memory units, a decoding code rate may be determined based on the stored code rate flag for the one or more memory units, and host data for the one or memory units decoded based on the determined decoding code rate.

Figure 4:
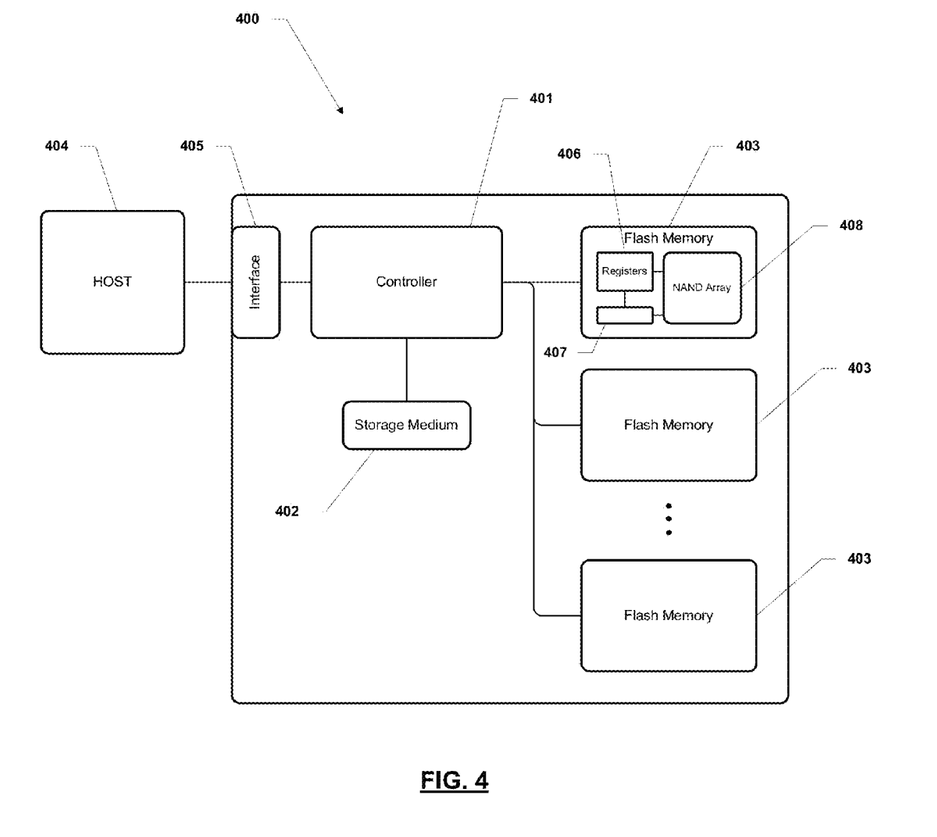
FIG. 4 is a block diagram illustrating example components of a data storage system 400 (for example, a solid state drive)

FIG. 4 is a block diagram illustrating example components of a data storage system 400 (for example, a solid state drive), according to one aspect of the subject technology. Data storage system 400 (for example, a solid state drive) may include a data storage controller 401, storage medium 402, and flash memory 403. Controller 401 may use storage medium 402 for temporary storage of data and information used to manage data storage system 400. Controller 401 may include several internal components (not shown) such as one or more processors, a read-only memory, a flash component interface (for example, a multiplexer to manage instruction and data transport along a serial connection to flash memory 403), an I/O interface, error correction circuitry, and the like. In some aspects, all of these elements of controller 401 may be integrated into a single chip. In other aspects, these elements may be separated on their own PC board.

Controller 401 may also include a processor configured to execute code or instructions to perform the operations and functionality described herein, manage request flow and address mappings, and to perform calculations and generate commands. The processor of controller 401 is configured to monitor and control the operation of the components in data storage controller 401. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 401 and/or its processor. One or more sequences of instructions may be software stored and read from storage medium 402, flash memory 403, or received from host device 404 (for example, via host interface 405). ROM, storage medium 402, flash memory 403, represent examples of machine or computer readable media on which instructions/code executable by controller 401 and/or its processor may be stored. Machine or computer readable media may generally refer to any medium or media used to provide instructions to controller 401 and/or its processor, including both volatile media, such as dynamic memory used for storage media 402 or for buffers within controller 401, and non-volatile media, such as electronic media, optical media, and magnetic media.

In some aspects, controller 401 is configured to store data received from a host device 404 in flash memory 403 in response to a write command from host device 404. Controller 401 is further configured to read data stored in flash memory 403 and to transfer the read data to host device 404 in response to a read command from host device 404. As will be described in more detail below, controller 401 is configured to, on determining certain operating conditions are present, suspend an erase operation performed on a block and/or page of memory. By dynamically and selectively suspending erase operations performed on flash memory 403, the subject technology may improve SSD performance and reduce flash memory wear compared to performance of SSD using flash memory cells in the same application environment without the ability to dynamically suspend erase operations.

Host device 404 represents any device configured to be coupled to data storage system 400 and to store data in data storage system 400. Host device 404 may be a computing system such as a personal computer, a server, a workstation, a laptop computer, PDA, smart phone, and the like. Alternatively, host device 404 may be an electronic device such as a digital camera, a digital audio player, a digital video recorder, and the like.

In some aspects, storage medium 402 represents volatile memory used to temporarily store data and information used to manage data storage system 400. According to one aspect of the subject technology, storage medium 402 is random access memory (RAM) such as double data rate (DDR) RAM. Other types of RAM also may be used to implement storage medium 402. Memory 402 may be implemented using a single RAM module or multiple RAM modules. While storage medium 402 is depicted as being distinct from controller 401, those skilled in the art will recognize that storage medium 402 may be incorporated into controller 401 without departing from the scope of the subject technology. Alternatively, storage medium 402 may be a non-volatile memory such as a magnetic disk, flash memory, peripheral SSD, and the like.

As further depicted in FIG. 6, data storage system 400 may also include host interface 405. Host interface 405 is configured to be coupled to host device 404, to receive data from host device 404 and to send data to host device 404. Host interface 405 may include both electrical and physical connections for operably coupling host device 404 to controller 401, for example, via the I/O interface of controller 401. Host interface 405 is configured to communicate data, addresses, and control signals between host device 404 and controller 401. Alternatively, the I/O interface of controller 401 may include and/or be combined with host interface 405. Host interface 405 may be configured to implement a standard interface, such as Serial-Attached SCSI (SAS), Fiber Channel interface, PCI Express (PCIe), SATA, USB, and the like. Host interface 405 may be configured to implement only one interface. Alternatively, host interface 405 (and/or the I/O interface of controller 401) may be configured to implement multiple interfaces, which are individually selectable using a configuration parameter selected by a user or programmed at the time of assembly. Host interface 405 may include one or more buffers for buffering transmissions between host device 404 and controller 401.

Flash memory 403 represents a non-volatile memory device for storing data. According to one aspect of the subject technology, flash memory 403 includes, for example, a NAND flash memory. Flash memory 403 may include a single flash memory device or chip, or, as depicted by FIG. 1, may include multiple flash memory devices or chips arranged in multiple channels. Flash memory 403 is not limited to any particular capacity or configuration. For example, the number of physical blocks, the number of physical pages per physical block, the number of sectors per physical page, and the size of the sectors may vary within the scope of the subject technology.

Flash memory may have a standard interface specification. This standard ensures that chips from multiple manufacturers can be used interchangeably (at least to a large degree). The interface may further hide the inner working of the flash memory and return only internally detected bit values for data. The interface of flash memory 403 may be used to access one or more internal registers 406 and an internal flash controller 407. In some aspects, registers 406 may include address, command, control, and/or data registers, which internally retrieve and output the necessary data to and from a NAND memory cell array 408. For example, a data register may include data to be stored in memory array 408, or data after a fetch from memory array 408, and may also be used for temporary data storage and/or act like a buffer. An address register may store the memory address from which data will be fetched to host 404 or the address to which data will be sent and stored. In some aspects, a command register may be included to control parity, interrupt control, and/or the like. In some aspects, internal flash controller 407 is accessible via a control register to control the general behavior of flash memory 403. Internal flash controller 407 and/or the control register may control the number of stop bits, word length, receiver clock source, and may also control switching the addressing mode, paging control, coprocessor control, and the like.

In some aspects, registers 406 may include a test register. The test register may, for example, be accessed by specific addresses and/or data combinations provided at the interface of flash memory 403 (for example, by specialized software provided by the manufacturer to perform various tests on the internal components of the flash memory). The test register may be used to access and/or modify other internal registers, for example, the command and/or control registers. In some aspects, test modes accessible via the test register may be used to input or modify certain programming conditions of flash memory 403 (for example, erase parameters) to dynamically vary how data is programmed or erased from the memory cells of memory arrays 408.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A method for adjusting a code rate in a solid-state drive, the method comprising:
    storing host data in a first plurality of memory units of a flash memory device using a first code rate;
    monitoring an operating condition associated with the flash memory device for a trigger event;
    adjusting, on the trigger event, the first code rate in accordance with the operating condition to produce a second code rate; and
    storing host data in a second plurality of memory units of the flash memory device using the second code rate.

2. The method of claim 1, wherein the operating condition comprises a number of program/erase (P/E) cycles.

3. The method of claim 2, wherein the trigger event comprises the number of P/E cycles satisfying a threshold number of P/E cycles.

4. The method of claim 2, further comprising:
    determining, on the trigger event, the second code rate by indexing a lookup table by a current range of P/E cycles.

5. The method of claim 1, wherein the operating condition comprises an error rate.

6. The method of claim 5, wherein the trigger event comprises the error rate satisfying a threshold error rate.

7. The method of claim 5, further comprising:
    determining, on the trigger event, the second code rate by indexing a lookup table by a current range of error rates.

8. The method of claim 1, further comprising:
    decoding host data from the first plurality of memory units at the first code rate; and
    decoding host data from the second plurality of memory units at the second code rate.

9. The method of claim 1, further comprising:
    storing a code rate flag in connection with encoding host data for one or more respective memory units;
    determining, in connection with reading one or more respective memory units, a decoding code rate based on the stored code rate flag for one or more respective memory units; and
    decoding host data for one or more respective memory units based on the determined decoding code rate.

10. The method of claim 1, wherein adjusting the first code rate comprises:
    reducing the first code rate by an amount predetermined to sustain a raw read error rate associated with one or more memory blocks below a predetermined threshold for a predetermined number of P/E cycles.

11. The method of claim 1, wherein the second code rate has a lower code rate value than the first code rate.

12. The method of claim 1, wherein adjusting the first code rate modifies an amount of storage available for user data in future operations.

13. The method of claim 1, wherein the code rate is a LDPC code rate.

14. A non-transitory machine-readable medium having instructions stored thereon that, when executed, cause a machine to perform a method for adjusting a code rate in a solid state drive, the method comprising:
    receiving a first quantity of host data;
    encoding, for storage in a first plurality of memory units, a first quantity of host data at a first code rate, the first code rate corresponding to a predetermined code rate value;
    storing the encoded first quantity of host data in the first plurality of memory units;
    monitoring one or more operating conditions associated with the one or more memory units for a trigger event;
    adjusting, on a predetermined trigger event, the code rate value;
    receiving a second quantity of host data;
    encoding, for storage in a second plurality of memory units, a second quantity of host data at a second code rate; and
    storing the encoded second quantity of host data in the second plurality of memory units.

15. The non-transitory machine readable medium of claim 14, wherein adjusting the code rate value comprises:
    adjusting the code rate value by an amount sufficient to reduce, below a predetermined threshold, a read error rate produced in connection with future memory operations.

16. The non-transitory machine readable medium of claim 14, wherein the one or more operating conditions comprise an error rate or a number of program/erase cycles, and wherein the trigger event comprises a threshold error rate or threshold program/erase cycle.

17. The non-transitory machine readable medium of claim 14, further comprising:
    decoding host data from the first plurality of memory units at the first code rate; and
    decoding host data from the second plurality of memory units at the second code rate.

18. The non-transitory machine readable medium of claim 14, further comprising:
    storing a code rate flag in connection with encoding host data for the one or more memory units;
    determining, in connection with reading one or more respective memory units, a decoding code rate based on the stored code rate flag for one or more respective memory units; and decoding host data from one or more respective memory units based on the determined decoding code rate.

19. The non-transitory machine readable medium of claim 14, wherein the code rate is a LDPC code rate.

20. A system, comprising:
a flash controller;
one or more flash memory devices; and
one or more embedded memories associated with the controller, the memories having instructions stored thereon that, when executed, cause the flash controller to:
monitor one or more operating conditions associated with the one or more flash memory devices for one or more trigger events; and
adjust, on a predetermined trigger event, a LDPC code rate used in current memory operations performed by the flash controller by an amount sufficient to reduce, below a predetermined threshold, a read error rate produced in connection with future memory operations,
wherein host data is stored in a first plurality of memory units using a first code rate before the LDPC code rate is adjusted, and host data is stored in a second plurality of memory units using a second code rate after the LDPC code rate is adjusted.

* * * * *